(12) United States Patent
Shi

(10) Patent No.: US 10,480,108 B2
(45) Date of Patent: *Nov. 19, 2019

(54) CERAMIC MATRIX COMPOSITE COMPONENTS REINFORCED FOR MANAGING MULTI-AXIAL STRESSES AND METHODS FOR FABRICATING THE SAME

(71) Applicant: Rolls-Royce Corporation, Indianapolis, IN (US)

(72) Inventor: Jun Shi, Carmel, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 288 days.

This patent is subject to a terminal disclaimer.

(21) Appl. No.: 15/446,582

(22) Filed: Mar. 1, 2017

(65) Prior Publication Data

US 2018/0251921 A1    Sep. 6, 2018

(51) Int. Cl.
| | |
|---|---|
| *D03D 25/00* | (2006.01) |
| *D03D 15/00* | (2006.01) |
| *C04B 35/622* | (2006.01) |
| *F01D 5/18* | (2006.01) |
| *F01D 9/02* | (2006.01) |
| *F01D 11/00* | (2006.01) |

(Continued)

(52) U.S. Cl.
CPC ........... *D03D 25/005* (2013.01); *B22F 5/009* (2013.01); *B22F 5/04* (2013.01); *C04B 35/62227* (2013.01); *C04B 35/806* (2013.01); *C22C 47/08* (2013.01); *C22C 49/14* (2013.01); *C23C 16/00* (2013.01); *D03D 15/00* (2013.01); *F01D 5/187* (2013.01); *F01D 5/282* (2013.01); *F01D 5/284* (2013.01); *F23R 3/007* (2013.01); *C04B 2235/5252* (2013.01); *C04B 2235/5268* (2013.01); *C04B 2235/616* (2013.01); *D10B 2101/08* (2013.01); *D10B 2505/02* (2013.01); *F05D 2240/11* (2013.01); *F05D 2300/6033* (2013.01); *F05D 2300/6034* (2013.01); *F23R 2900/00018* (2013.01)

(58) Field of Classification Search
None
See application file for complete search history.

(56) References Cited

U.S. PATENT DOCUMENTS 3,444,925 A * 5/1969 Johnson ................ B22F 3/1115
165/10
5,308,228 A * 5/1994 Benoit .................. B29C 70/543
416/230

(Continued)

*Primary Examiner* — Shawn Mckinnon
(74) *Attorney, Agent, or Firm* — Brinks, Gilson & Lione

(57) ABSTRACT

Ceramic matrix composite components and methods for fabricating ceramic matrix composite components are provided. In one example, a ceramic matrix composite component includes a ceramic matrix composite body. The ceramic matrix composite body includes a layer-to-layer weave of ceramic fibers and a layer of 1-directional and/or 2-directional (1D/2D) fabric of ceramic fibers disposed adjacent to the layer-to-layer weave. When stressed, the ceramic matrix composite body forms a relatively high through-thickness stress region and a relatively high in-plane bending stress region. The layer-to-layer weave is disposed through the relatively high through-thickness stress region and the layer of 1D/2D fabric is disposed through the relatively high in-plane bending stress region.

20 Claims, 3 Drawing Sheets

(51) Int. Cl.

| | |
|---|---|
| *F01D 25/12* | (2006.01) |
| *F23R 3/00* | (2006.01) |
| *F02C 7/12* | (2006.01) |
| *C22C 29/00* | (2006.01) |
| *C23C 6/00* | (2006.01) |
| *F01D 5/28* | (2006.01) |
| *C23C 16/00* | (2006.01) |
| *C04B 35/80* | (2006.01) |
| *B22F 5/00* | (2006.01) |
| *B22F 5/04* | (2006.01) |
| *C22C 47/08* | (2006.01) |
| *C22C 49/14* | (2006.01) |

(56) References Cited

U.S. PATENT DOCUMENTS

| | | |
|---|---|---|
| 6,241,471 B1 | 6/2001 | Herron |
| 6,441,341 B1 * | 8/2002 | Steibel ............... B23K 26/1476 219/121.71 |
| 6,742,783 B1 | 6/2004 | Lawer et al. |
| 2005/0238491 A1 | 10/2005 | Morrison et al. |
| 2006/0130957 A1 | 6/2006 | Kostar et al. |
| 2008/0170945 A1 | 7/2008 | Barrett |
| 2010/0015394 A1 | 1/2010 | Morrison et al. |
| 2013/0062808 A1 | 3/2013 | Bremmer et al. |
| 2013/0089429 A1 | 4/2013 | Nunez et al. |
| 2013/0243604 A1 | 9/2013 | Roussille et al. |
| 2014/0205463 A1 | 7/2014 | Herraiz et al. |
| 2014/0247412 A1 | 9/2014 | Yamazaki et al. |
| 2014/0251378 A1 | 9/2014 | Beidler et al. |

* cited by examiner

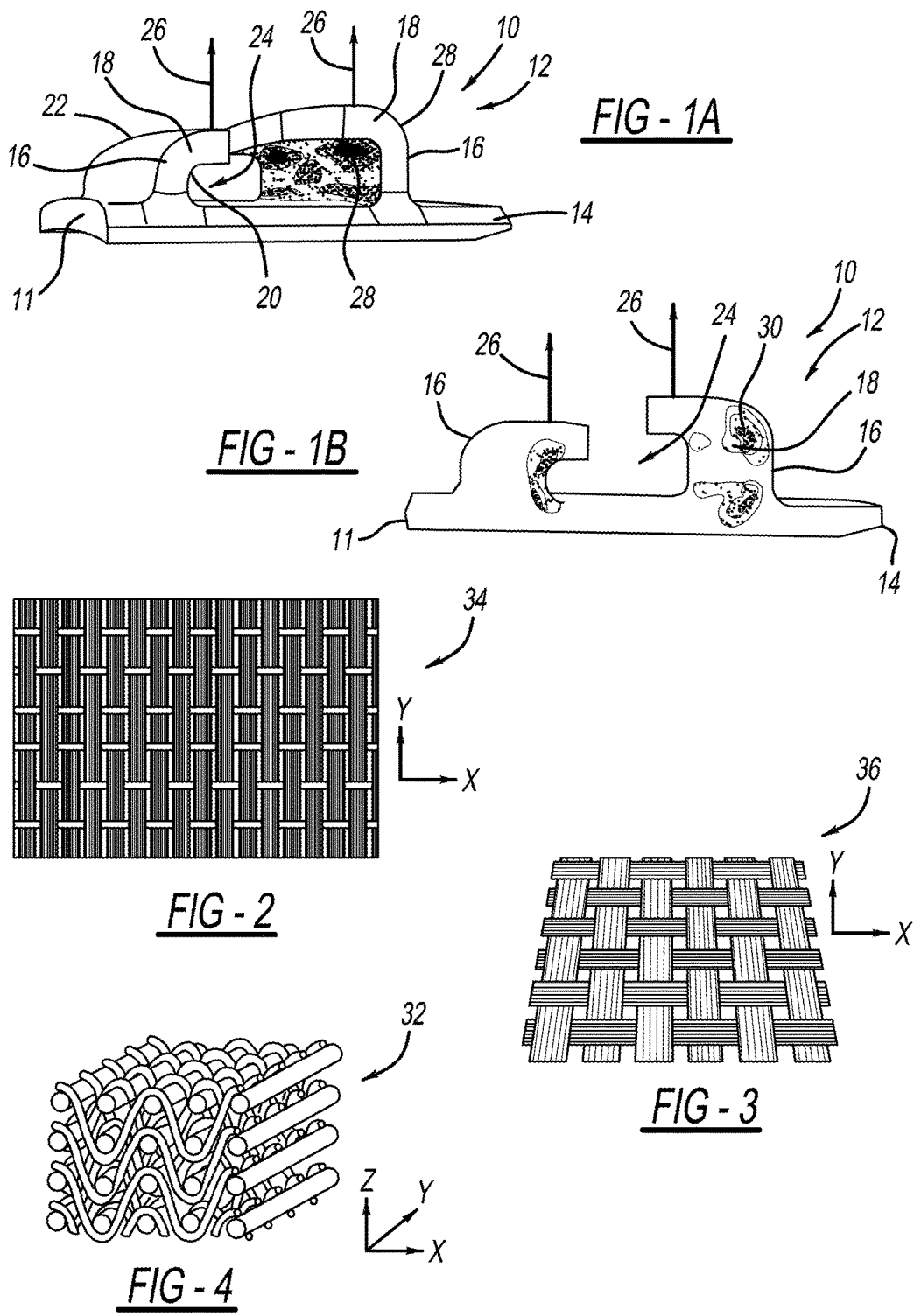

CERAMIC MATRIX COMPOSITE COMPONENTS REINFORCED FOR MANAGING MULTI-AXIAL STRESSES AND METHODS FOR FABRICATING THE SAME

TECHNICAL FIELD

The present disclosure relates generally to ceramic matrix composite (CMC) components, and more particularly to CMC components that are reinforced with a hybrid ceramic fiber architecture for managing multi-axial stresses and methods for fabricating such CMC components.

BACKGROUND

Ceramic matrix composites (CMC) are used for making components for relatively high-strength (for example, high-pressure), high-temperature applications such as for various components in gas turbines and the like. The components may be fabricated by laminating multiple layers of ceramic fibers in a ceramic matrix. In such constructions, the ceramic fibers effectively act as load bearing members and the ceramic matrix effectively acts as a load transferring mechanism for transferring the load between the load bearing members when the CMC component is stressed.

Due to mechanical and/or thermal loading, the stress state in a CMC component can be multi-axial, for example, including both in-plane bending stresses and through-thickness stresses. The in-plane bending stresses may tend to peak, for example, at or proximate a CMC component surface and decrease to about zero at or proximate the mid-thickness position of the CMC component. Contrary to the in-plane bending stresses, the through-thickness stresses may tend to peak, for example, at or proximate the mid-thickness position of the CMC component and drop to about zero at or proximate the CMC component surface.

CMC components are typically made, for example, from stacks or layups of 1-directional (e.g., unidirectional) fabrics or 2-directional (e.g., bidirectional) fabrics. Ceramic matrix composites fabricated with 1-directional fabrics are relatively very strong in the fiber direction (e.g., direction of the unidirectional fiber tows), but are relatively weak in the direction transverse to the unidirectional fiber tows. 2-directional fabrics have fiber tows running, for example, in two directions. Such 2-directional fiber constructions help to strengthen the ceramic matrix composite in the two directions corresponding to directions of the bidirectional fibers tows. However, the bidirectional fiber tow crossover regions of the fabric can create weak areas from stress concentration. Additionally, fiber volume fraction ratios can be relatively low due to ceramic matrix infiltration and the fibers being split into two different directions. As such, 2-directional fabrics can have lower in-plane strength compared to 1-directional fabrics in the fiber direction. Additionally, both 1-directional fabrics and 2-directional fabrics have relatively low through-thickness strengths as there are no fibers extending in the direction normal to the fabric layer.

Accordingly, it is desirable to provide CMC components with improved through-thickness strength without compromising in-plane strength and methods for fabricating such CMC components. Furthermore, other desirable features and characteristics of the present disclosure will become apparent from the subsequent detailed description and the appended claims, taken in conjunction with the accompanied drawings and this background.

BRIEF SUMMARY

Ceramic matrix composite components and methods for fabricating ceramic matrix composite components are provided herein. In accordance with an exemplary embodiment, a ceramic matrix composite component includes a ceramic matrix composite body. The ceramic matrix composite body includes a layer-to-layer weave of ceramic fibers and at least one layer of 1-directional and/or 2-directional (1D/2D) fabric of ceramic fibers disposed adjacent to the layer-to-layer weave. When stressed, the ceramic matrix composite body forms a relatively high through-thickness stress region and a relatively high in-plane bending stress region. The layer-to-layer weave is disposed through the relatively high through-thickness stress region and the at least one layer of 1D/2D fabric is disposed through the relatively high in-plane bending stress region.

In accordance with another exemplary embodiment, a method for fabricating a ceramic matrix composite component is provided. The method includes forming a porous ceramic preform into a ceramic matrix composite body. The porous ceramic preform includes a layer-to-layer weave of ceramic fibers and at least one layer of 1-directional and/or 2-directional (1D/2D) fabric of ceramic fibers. The layer-to-layer weave and the at least one layer of 1D/2D fabric are disposed in the ceramic matrix composite body such that when the ceramic matrix composite body is stressed to form a relatively high through-thickness stress region and a relatively high in-plane bending stress region, the layer-to-layer weave is disposed through the relatively high through-thickness stress region and the at least one layer of 1D/2D fabric is disposed through the relatively high in-plane bending stress region.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIG. 1A is a perspective view of a ceramic matrix composite component that has been stressed to illustrate a relatively high in-plane bending stress region(s) in accordance with an exemplary embodiment;

FIG. 1B is a perspective view of a ceramic matrix composite component that has been stressed to illustrate a relatively high through-thickness stress region(s) in accordance with an exemplary embodiment;

FIG. 2 is a top view of a 1-directional (unidirectional) fabric of ceramic fibers in accordance with an exemplary embodiment;

FIG. 3 is a perspective view of a 2-directional fabric of ceramic fibers in accordance with an exemplary embodiment;

FIG. 4 is a perspective view of a layer-to-layer weave of ceramic fibers in accordance with an exemplary embodiment;

DETAILED DESCRIPTION

Figure 5:
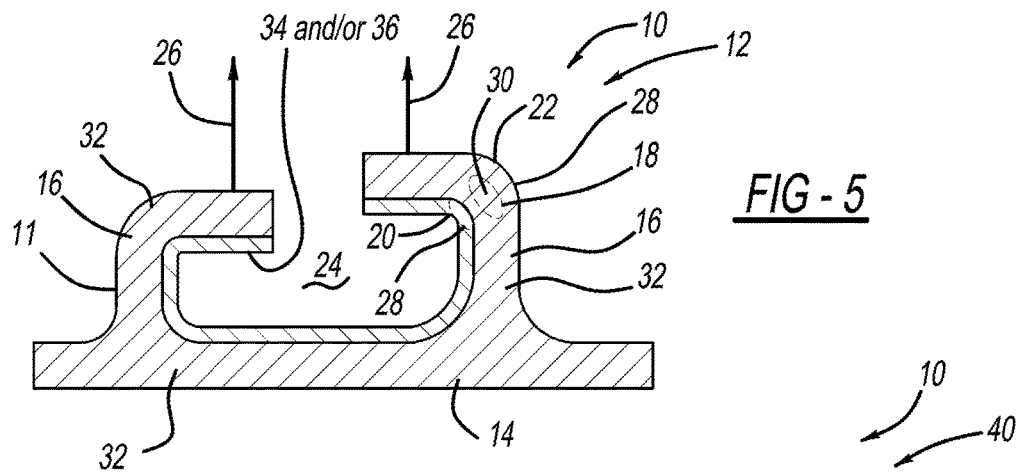
FIG. 5 is a side view of a ceramic matrix composite component in accordance with an exemplary embodiment.

The following detailed description is merely exemplary in nature and is not intended to limit the disclosure or the application and uses of the disclosure. Furthermore, there is no intention to be bound by any theory presented in the preceding background or the following detailed description.

Various embodiments contemplated herein relate to ceramic matrix composite (CMC) components and methods for fabricating such CMC components. The exemplary embodiments taught herein provide a ceramic matrix composite component that includes a ceramic matrix composite body. The ceramic matrix composite body includes a layer-to-layer weave of ceramic fibers and at least one layer of 1-directional and/or 2-directional (1D/2D) fabric of ceramic fibers disposed adjacent to the layer-to-layer weave.

In some examples, the ceramic fibers may be a bundle and/or a tow of ceramic fibers. The fibers in each bundle or tow may be braided or otherwise arranged. The ceramic fibers may comprise a material that is stable at temperatures above 1000 degrees Celsius (° C.). Examples of the ceramic fibers may include fibers of alumina, mullite, silicon carbide, zirconia or carbon. The ceramic fibers may not be organic, metallic or glass fibers. The ceramic matrix composite body includes the ceramic fibers in a ceramic matrix material, such as, for example, a silicon carbide ceramic matrix material or the like.

In an exemplary embodiment, the layer-to-layer weave of ceramic fibers is a 2.5-dimensional or 3-dimensional weave of ceramic fibers. As used herein, a 2.5-dimensional or 3-dimensional weave is understood to mean a generally orthogonal woven structure containing a first set of layers of fibers lying in and/or substantially parallel to an X-Y plane defined by an X-axis and a Y-axis, and a second set of fibers lying in and/or substantially parallel to a Z-axis (for example, axis perpendicular to X-Y plane) and woven through the first set of layers of fibers. In particular, in a 3-dimensional weave, all of the fibers of the second set lying in and/or substantially parallel to the Z-axis are each woven through all of the first set of layers of fibers lying in and/or substantially parallel to the X-Y plane. In a 2.5-dimensional weave, various fibers of the second set lying in and/or substantially parallel to the Z-axis are woven through different layers of the first set of layers of fibers lying in and/or substantially parallel to the X-Y plane such that all of the first set of layers of fibers are woven to various fibers of the second set. An example of a layer-to-layer weave 32 of ceramic fibers is shown in FIG. 4.

In an exemplary embodiment, 1D fabric of ceramic fibers is a fabric layer consisting of or consisting essentially of (e.g., may include a minimum or minority of transverse sacrificial fibers for holding the unidirectional ceramic fibers together) substantially juxtaposed unidirectional ceramic fibers. An example of a 1D fabric 34 of ceramic fibers is shown in FIG. 2. Further, a 2D fabric of ceramic fibers is a fabric layer consisting of or consisting essentially of substantially bidirectional ceramic fibers. The fabric layer may be, for example, woven, braided, or filament wound. An example of a 2D fabric 36 of ceramic fibers is shown in FIG. 3.

The layer-to-layer weave of ceramic fibers and the at least one layer of 1D/2D fabric of ceramic fibers are arranged adjacent to each other in the ceramic matrix composite body such that when the ceramic matrix composite body is stressed, thereby forming a relatively high through-thickness stress region and a relatively high in-plane bending stress region, the layer-to-layer weave is disposed through the relatively high through-thickness stress region and the at least one layer of 1D/2D fabric is disposed through the relatively high in-plane bending stress region. It has been found that by using the layer-to-layer weave of ceramic fibers (e.g., 2.5-dimensional or 3-dimensional weave of ceramic fibers) in a particular region of the ceramic matrix composite body, which when stressed, has a relatively high through-thickness stress, the region is sufficiently reinforced with ceramic fibers along multiple axes or directions (for example, along the X-, Y-, and Z-axes) for enhancing and/or improving the mechanical and/or structural properties in this region for managing through-thickness stresses. Further, it has been found that using the at least one layer of 1D/2D fabric of ceramic fibers in another region of the ceramic matrix composite body, which when stressed, has a relatively high in-plane bending stress, the region is sufficiently reinforced with ceramic fibers in the in-plane directions (for example, along the X-axis and/or Y-axis) for enhancing and/or improving the mechanical and/or structural properties in this region for managing in-plane bending stresses.

FIGS. 1A and 1B are perspective views of a ceramic matrix composite component 10 that includes a ceramic matrix composite body 11 that is being stressed in accordance with an exemplary embodiment. FIG. 5 is a sectional view of the ceramic matrix composite component 10 depicted in FIGS. 1A-1B. The ceramic matrix composite body 11 may have various shapes or forms, not just the shape illustrated in FIGS. 1A-1B and 5. The ceramic matrix composite component 10 may be a component of a gas turbine engine such as forming at least part of a seal segment, a combustion liner, a turbine blade, a turbine vane, or another other part(s) that may be subjected to intense heat and/or pressure. As illustrated, the ceramic matrix composite component 10 forms at least part of a seal segment 12 of a gas turbine engine.

The seal segment 12 has a seal segment base 14 and seal segment supports 16 extending transversely (e.g., upwardly) from the seal segment base 14. The seal segment supports 16 each have an interior mid-section 18 (e.g., mid-thickness section) that separates a substantially concave outer surface section 20 and a substantially convex outer surface section 22. The adjacent seal segment supports 16 including the substantially concave outer surface sections 20 together with the seal segment base 14 form a cooling cavity 24.

During operation of the gas turbine engine, high-pressure cooling air is directed through the cooling cavity 24 resulting in mechanical and/or thermal loads being applied to the seal segment 12. In particular, a resultant net load(s) (indicated by single headed arrows 26) of the mechanical and/or thermal loads is effectively applied to the seal segment supports 16, thereby resulting in multi-axial stresses in the seal segment supports 16. In an exemplary embodiment and as illustrated in FIGS. 1A-1B, these multi-axial stresses are produced in various regions of the seal segment supports 16 in which regions 28 have relatively high in-plane bending stresses (e.g., relatively high in-plane bending stress regions) while other regions 30 of the seal segment 12 supports have relatively high through-thickness stresses (e.g., relatively high through-thickness stress regions).

As illustrated, the relatively high in-plane bending stress regions 28 correspond to or occur in the substantially concave outer surface sections 20 and the substantially convex outer surface sections 22. In this particular embodiment, the relatively high in-plane bending stress regions 28 at the substantially concave outer surface section 20 is a tensile stress (e.g., relatively high in-plane tensile stress regions) and the relatively high in-plane bending stress regions 28 at substantially convex outer surface section 22 is a compression stress (e.g., relatively high in-plane compression stress region). Additionally, the relatively high through-thickness stress regions 30 correspond to or occur in the interior mid-sections 18 of the seal segment 12 in which the stress regions 30 include a tensile stress component (e.g., relatively high through-thickness tensile stress regions) and further, can also include a shear stress component.

In an exemplary embodiment and as illustrated in FIGS. 2-5, the body 11 of the seal segment 12 includes a layer-to-layer weave 32 of ceramic fibers and at least one layer of 1-D fabric 34 and/or 2-D fabric 36 of ceramic fibers disposed adjacent to the layer-to-layer weave 32. As discussed above, when the body 11 is stressed (e.g., via mechanical and/or thermal loading), multi-axial stresses are produced in various regions of the body 11 including relatively high through-thickness stresses in the regions 30 and relatively high in-plane bending stresses in the regions 28. The layer-to-layer weave 32 is positioned in the body 11 such that the layer-to-layer weave 32 extends through the regions 30 (e.g., relatively high through-thickness stress regions) which corresponds to the interior mid-sections 18 of the body 11. Further, the one or more layers of 1D/2D fabric 34 and/or 36 extend through the regions 28 (e.g., the relatively high in-plane bending stress regions) which corresponds to the substantially concave outer surface sections 20. As discussed above, the relatively high in-plane bending stress region 28 at the substantially concave outer surface section 20 is a tensile stress. Further and as illustrated in this embodiment, the layer-to-layer weave 32 extends through the substantially convex outer surface section 22 which includes a compression stress component when the body 11 is stressed. Alternatively, one or more layers of 1D/2D fabric 34 and/or 36 could extend through the substantially convex outer surface section 22 instead of the layer-to-layer weave 32. In an exemplary embodiment, it has been found that the compressive strength of the layer-to-layer weave 32 and the one or more layers of 1D/2D fabric 34 and/or 36 are comparable and primarily a function of the ceramic matrix material rather than the fiber reinforcement and therefore, the layer-to-layer weave 32 and the one or more layers of 1D/2D fabric 34 and/or 36 can independently provide robust compressive strength for managing compressive loading and stresses.

Depending upon the thickness or thicknesses of the body 11 and the multi-axial stress conditions typically produced during operation of the gas turbine engine, more than one layer of 1-D fabric 34 and/or 2-D fabric 36 may be used to form the body 11 and further, the thickness of the layer-to-layer weave 32 may be adjusted accordingly. In one example, the body 11 includes two to four layers of 1-D fabric 34 and/or 2-D fabric 36 together with the layer-to-layer weave 32. In another example, the body 11 includes one or more layers of 1D/2D fabric 34 and/or 36 together with the layer-to-layer weave 32 in which the layer-to-layer weave 32 includes six to eight layers of fabric that are woven together (e.g., along the z-axis).

Figure 6:
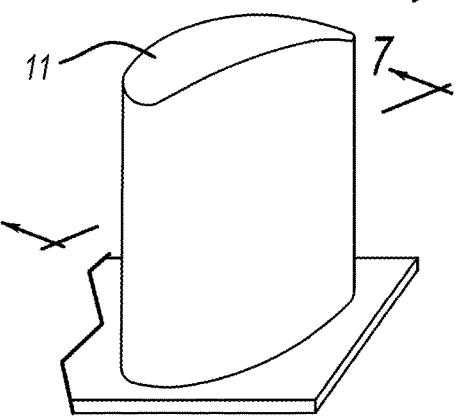
FIG. 6 is a perspective view of a ceramic matrix composite component in accordance with an exemplary embodiment.
Figure 7A:
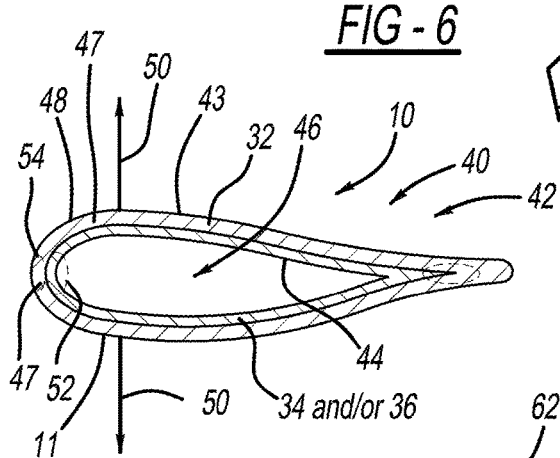
FIG. 7A is a sectional view of the ceramic matrix composite component depicted in FIG. 6 along line 7-7 in accordance with an exemplary embodiment.

FIG. 6 is a perspective view of the ceramic matrix composite component 10 in which the body 11 is configured as a vane or blade 40 of the gas turbine engine. FIG. 7A is a sectional view of the vane or blade 40 depicted in FIG. 6 configured as an internally cooled vane or blade 42. As illustrated, the internally cooled vane or blade 42 has a wall 43 surrounds a cooling channel 46. The wall 43 has an inside-facing outer surface section 44 that faces and surrounds the cooling channel 46, an interior mid-section 47 surrounding the inside-facing outer surface section 44, and an outside-facing outer surface section 48 surrounding the interior mid-section 47.

During operation of the gas turbine engine, high-pressure cooling air is directed through the cooling channel 46 resulting in mechanical and/or thermal loads being applied to the internally cooled vane or blade 42. In particular, a resultant net load(s) (indicated by single headed arrows 50) of the mechanical and/or thermal loads is effectively applied to the internally cooled vane or blade 42, thereby resulting in multi-axial stresses in the internally cooled vane or blade 42. In an exemplary embodiment and as illustrated in FIG. 7A, these multi-axial stresses are produced in various regions of the internally cooled vane or blade 42 in which region 52 has relatively high in-plane bending stresses (e.g., relatively high in-plane tensile stresses) while region 54 of the internally cooled vane or blade 42 has relatively high through-thickness stresses (e.g., relatively high through-thickness stress regions).

As illustrated, the relatively high in-plane bending stress region 52 corresponds to or occurs at the inside-facing outer surface section 44. The relatively high through-thickness stress region 54 correspond to or occurs at the interior mid-sections 47 of the internally cooled vane or blade 42 in which the stress regions 54 include a tensile stress component (e.g., relatively high through-thickness tensile stress region) and further, can also include a shear stress component.

In an exemplary embodiment, the body 11 of the internally cooled vane or blade 42 includes a layer-to-layer weave 32 of ceramic fibers and at least one layer of 1-D fabric 34 and/or 2-D fabric 36 of ceramic fibers disposed adjacent to the layer-to-layer weave 32. As discussed above, when the body 11 is stressed (e.g., via mechanical and/or thermal loading), multi-axial stresses are produced in various regions of the body 11 including the relatively high through-thickness stresses in the region 54 and the relatively high in-plane bending stresses in the region 52. The layer-to-layer weave 32 is positioned in the body 11 such that the layer-to-layer weave 32 extends through the region 54 (e.g., relatively high through-thickness stress region) which corresponds to the interior mid-sections 47 of the body 11. Further, the one or more layers of 1D/2D fabric 34 and/or 36 extend through the region 52 (e.g., the relatively high in-plane bending stress region) which corresponds to the inside-facing outer surface section 44.

Figure 7B:
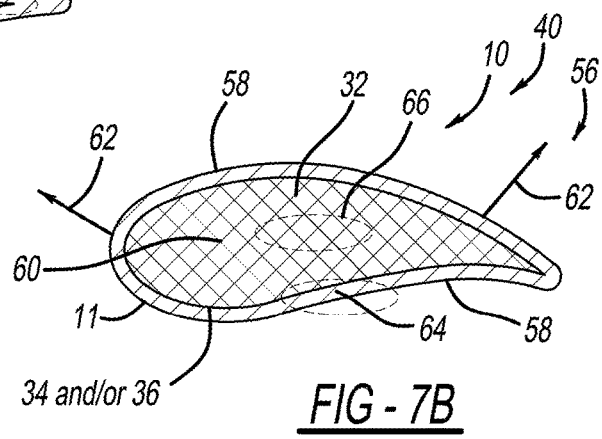
FIG. 7B is a sectional view of the ceramic matrix composite component depicted in FIG. 6 along line 7-7 in accordance with another exemplary embodiment.

FIG. 7B is a sectional view of the vane or blade 40 depicted in FIG. 6 configured as a non-internally cooled vane or blade 56. As illustrated, the non-internally cooled vane or blade 56 has an outer surface section 58 that surrounds a substantially solid interior mid-section 60.

During operation of the gas turbine engine, high temperature gas passes along the outer surface section 58 of the non-internally cooled vane or blade 56 resulting in mechanical and/or thermal loads being applied to the body 11. In particular, the non-internally cooled vane or blade 56 expands due to thermal loading to produce a resultant net load(s) (indicated by single headed arrows 62) that is effectively applied to the non-internally cooled vane or blade 56, thereby resulting in multi-axial stresses in the non-internally cooled vane or blade 56. In an exemplary embodiment and as illustrated in FIG. 7B, these multi-axial stresses are produced in various regions of the non-internally cooled vane or blade 56 in which region 64 has relatively high in-plane bending stresses (e.g., relatively high in-plane tensile stresses on the back side of the non-internally cooled vane or blade 56) while region 66 of the non-internally cooled vane or blade 56 has relatively high through-thickness stresses (e.g., relatively high through-thickness stress regions).

As illustrated, the relatively high in-plane bending stress region 64 corresponds to the outer surface section 58 (e.g., notably including a tensile stress component on the back side of the non-internally cooled vane or blade 56. The relatively high through-thickness stress region 66 correspond to the substantially solid interior mid-sections 60 of the non-internally cooled vane or blade 56 in which the stress region 66 include a tensile stress component (e.g., relatively high through-thickness tensile stress region) and further, can also include a shear stress component.

In an exemplary embodiment, the body 11 of the non-internally cooled vane or blade 56 includes a layer-to-layer weave 32 of ceramic fibers and at least one layer of 1-D fabric 34 and/or 2-D fabric 36 of ceramic fibers disposed adjacent to the layer-to-layer weave 32. As discussed above, when the body 11 is stressed (e.g., via mechanical and/or thermal loading), multi-axial stresses are produced in various regions of the body 11 including the relatively high through-thickness stresses in the region 66 and the relatively high in-plane bending stresses in the region 64. The layer-to-layer weave 32 is positioned in the body 11 such that the layer-to-layer weave 32 extends through the region 66 (e.g., relatively high through-thickness stress region) which corresponds to the substantially solid interior mid-section 60 of the body 11. Further, the one or more layers of 1D/2D fabric 34 and/or 36 extend through the region 64 (e.g., the relatively high in-plane bending stress region) which corresponds to the outer surface section 58.

Notably, on the front side of the non-internally cooled vane or blade 56, a relatively high in-plane bending stress that includes a compression stress component occurs at the outer surface section 58. As discussed above, in this embodiment, the one or more layers of 1D/2D fabric 34 and/or 36 extend through this relatively high in-plane compression stress region instead of the layer-to-layer weave 32 because the compressive strength of the layer-to-layer weave 32 and the one or more layers of 1D/2D fabric 34 and/or 36 can be comparable.

Figure 8:
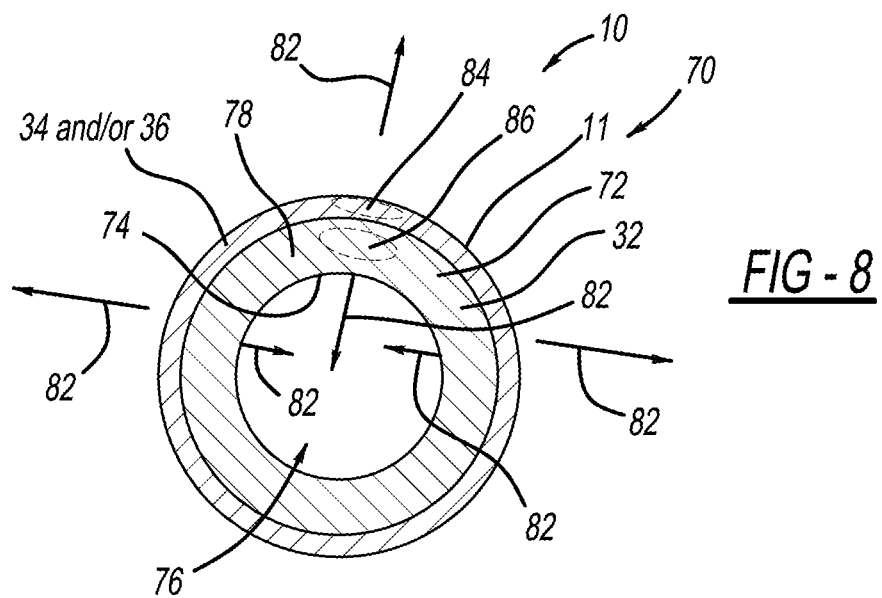
FIG. 8 is a sectional view of a ceramic matrix composite component in accordance with another exemplary embodiment.

FIG. 8 is a sectional view of the ceramic matrix composite component 10 that includes the ceramic matrix composite body 11 configured as an annular ceramic matrix composite combustor 70 of a gas turbine engine. As illustrated, the annular ceramic matrix composite combustor 70 has a wall 72 that includes an inside-facing outer surface section 74 surrounding a cooling channel 76, an interior mid-section 78 surrounding the inside-facing outer surface section 74, and an outside-facing outer surface section 80 surrounding the interior mid-section 78.

During operation of the gas turbine engine, high-pressure cooling air is directed through the cooling channel 76 resulting in mechanical and/or thermal loads being applied to the body 11. In particular, the annular ceramic matrix composite combustor 70 expands due to mechanical and/or thermal loading to produce a resultant net load(s) (indicated by single headed arrows 82) that is effectively applied to the body 11, thereby resulting in multi-axial stresses in the annular ceramic matrix composite combustor 70. In an exemplary embodiment, these multi-axial stresses are produced in various regions of the annular ceramic matrix composite combustor 70 in which region 84 has relatively high in-plane bending stresses (e.g., relatively high in-plane tensile stresses) while region 86 has of the annular ceramic matrix composite combustor 70 has relatively high through-thickness stresses (e.g., relatively high through-thickness stress regions).

As illustrated, the relatively high in-plane bending stress region 84 corresponds to the outside-facing outer surface section 80. The relatively high through-thickness stress region 86 correspond to the interior mid-section 78 of the annular ceramic matrix composite combustor 70 in which the stress region 86 include a tensile stress component (e.g., relatively high through-thickness tensile stress region) and further, can also include a shear stress component.

In an exemplary embodiment, the body 11 of the annular ceramic matrix composite combustor 70 includes a layer-to-layer weave 32 of ceramic fibers and at least one layer of 1-D fabric 34 and/or 2-D fabric 36 of ceramic fibers disposed adjacent to the layer-to-layer weave 32. As discussed above, when the body 11 is stressed (e.g., via mechanical and/or thermal loading), multi-axial stresses are produced in various regions of the body 11 including the relatively high through-thickness stresses in the region 86 and the relatively high in-plane bending stresses in the region 84. The layer-to-layer weave 32 is positioned in the body 11 such that the layer-to-layer weave 32 extends through the region 86 (e.g., relatively high through-thickness stress region) which corresponds to the substantially interior mid-section 78 of the body 11. Further, the one or more layers of 1D/2D fabric 34 and/or 36 extend through the region 84 (e.g., the relatively high in-plane bending stress region) which corresponds to the outside-facing outer surface section 80.

Figure 9:
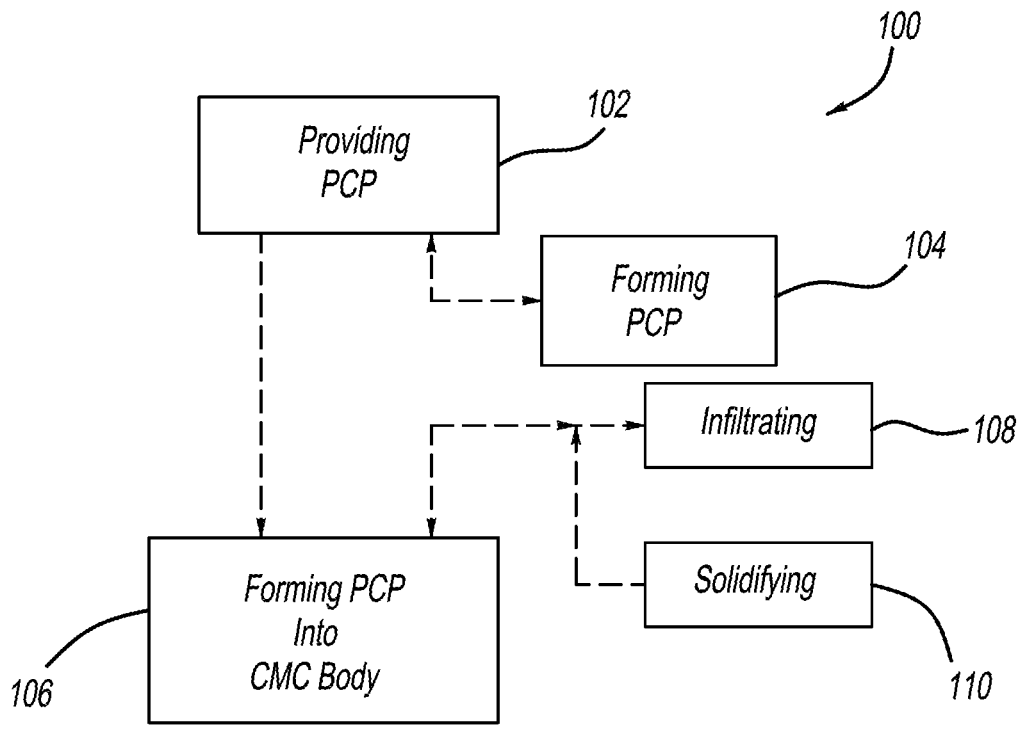
FIG. 9 is a flow diagram of an exemplary method for fabricating a ceramic matrix composite component.

FIG. 9 is a flow diagram of an exemplary method 100 for fabricating a ceramic matrix composite component. The method 100 may include additional, different, or fewer operations than illustrated in FIG. 9. The operations may be executed in a different order than illustrated in FIG. 9.

As illustrated, the method 100 includes providing a porous ceramic preform (PCP) (Step 102). The porous ceramic preform includes a layer-to-layer weave of ceramic fibers and at least one layer of 1-directional and/or 2-directional (1D/2D) fabric of ceramic fibers. In one example, the layer-to-layer weave includes a 2.5-dimensional weave of the ceramic fibers. In another example, the layer-to-layer weave includes a 3-dimensional weave of the ceramic fibers. In an exemplary embodiment, providing the porous ceramic preform includes forming the porous ceramic preform (Step 104) by stacking or laying up (e.g., arranging) the layer-to-layer weave of ceramic fibers and at least one layer of 1-directional and/or 2-directional (1D/2D) fabric of ceramic fibers to form a layup.

The porous ceramic preform is formed into a ceramic matrix composite body (Step 106). Forming the ceramic matrix composite body from the porous ceramic preform may include infiltrating a molten metal or alloy (for example, a silicon metal or alloy) into the porous ceramic preform (step 108). The molten metal or alloy is then solidified (Step 110), for example, via cooling, sintering, and/or the like to form a ceramic matrix. In one example, the silicon metal or alloy fills the gaps, pores, and/or voids between the ceramic fibers of the porous ceramic preform to form a continuous or substantially continuous ceramic matrix that is reinforced with the ceramic preform. The silicon metal or alloy may also react with a reactive element source present in the ceramic preform to form additional silicon based ceramic matrix material. In some examples, a chemical vapor infiltration coating may be applied to the porous ceramic preform prior to the melt infiltration to stiffen the ceramic fibers. Alternatively or in addition, forming the ceramic matrix composite body from the porous ceramic preform may include chemical vapor infiltrating the porous ceramic preform instead of melt infiltrating a material into the porous ceramic preform.

The porous ceramic preform is arranged in the ceramic matrix composite body such that when the ceramic matrix composite body is stressed to form a relatively high through-thickness stress region and a relatively high in-plane bending stress region, the layer-to-layer weave is disposed through the relatively high through-thickness stress region and the at least one layer of 1D/2D fabric is disposed through the relatively high in-plane bending stress region.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations. Furthermore, the advantages described above are not necessarily the only advantages, and it is not necessarily expected that all of the described advantages will be achieved with every embodiment.

What is claimed is:

1. A ceramic matrix composite component, the ceramic matrix composite component comprising:
   a ceramic matrix composite body comprising a layer-to-layer weave of ceramic fibers and at least one layer of 1-directional and/or 2-directional (1D/2D) fabric of ceramic fibers disposed adjacent to the layer-to-layer weave, the ceramic matrix composite body including a relatively high through-thickness stress region and a relatively high in-plane bending stress region, the layer-to-layer weave is disposed through the relatively high through-thickness stress region and the at least one layer of 1D/2D fabric is disposed through the relatively high in-plane bending stress region,
   wherein the ceramic matrix composite body includes an inside-facing outer surface section and an interior mid-section surrounding the inside-facing outer surface section, and wherein the at least one layer of 1D/2D fabric is disposed in the inside-facing outer surface section and the layer-to-layer weave is disposed in the interior mid-section.

2. The ceramic matrix composite component of claim 1, wherein the layer-to-layer weave comprises a 2.5-dimensional weave of ceramic fibers.

3. The ceramic matrix composite component of claim 1, wherein the layer-to-layer weave comprises a 3-dimensional weave of ceramic fibers.

4. The ceramic matrix composite component of claim 1, wherein the ceramic matrix composite body is a component of a gas turbine engine.

5. The ceramic matrix composite component of claim 4, wherein the ceramic matrix composite body is a seal segment of the gas turbine engine, wherein the inside-facing outer surface section is substantially concave.

6. The ceramic matrix composite component of claim 4, wherein the ceramic matrix composite body is a vane or blade of the gas turbine engine.

7. The ceramic matrix composite component of claim 6, wherein the vane or blade of the gas turbine engine is an internally cooled vane or blade, wherein the inside-facing outer surface section surrounds a cooling channel.

8. The ceramic matrix composite component of claim 1, wherein the relatively high in-plane bending stress region includes a relatively high in-plane tensile stress region and a relatively high in-plane compression stress region, wherein the relatively high through-thickness stress region is disposed between the relatively high in-plane tensile stress region and the relatively high in-plane compression stress region, and wherein the at least one layer of 1D/2D fabric is disposed through the relatively high in-plane tensile stress region.

9. The ceramic matrix composite component of claim 8, wherein the at least one layer of 1D/2D fabric is disposed through the relatively high in-plane compression stress region.

10. The ceramic matrix composite component of claim 8, wherein the layer-to-layer weave is disposed through the relatively high in-plane compression stress region.

11. A method for fabricating a ceramic matrix composite component, the method comprising:
    forming a porous ceramic preform into a ceramic matrix composite body, wherein the porous ceramic preform comprises a layer-to-layer weave of ceramic fibers and at least one layer of 1-directional and/or 2-directional (1D/2D) fabric of ceramic fibers by:
    arranging, the at least one layer of 1D/2D fabric on an inside facing surface of the ceramic matrix composite body in a relatively high in-plane bending stress region of the ceramic matrix composite body; and
    arranging the layer-to-layer weave in an interior mid-section surrounding the inside-facing outer surface section in a relatively high through-thickness stress region of the ceramic matrix composite body.

12. The method of claim 11, wherein forming the ceramic matrix composite body comprises:
    infiltrating a molten metal or alloy into the porous ceramic preform; and
    solidifying the molten metal or alloy to form the ceramic matrix composite body.

13. The method of claim 11, further comprising providing the porous ceramic preform comprising forming a layup that comprises the layer-to-layer weave and the at least one layer of 1D/2D fabric disposed adjacent to the layer-to-layer weave.

14. The method of claim 13, wherein forming the layup comprises arranging the layer-to-layer weave comprising a 2.5-dimensional weave of ceramic fibers in the layup.

15. The method of claim 13, wherein forming the layup comprises arranging the layer-to-layer weave comprising a 3-dimensional weave of ceramic fibers in the layup.

16. A ceramic matrix composite component, the ceramic matrix composite component comprising:
    a ceramic matrix composite body comprising a layer-to-layer weave of ceramic fibers and at least one layer of 1-directional and/or 2-directional (1D/2D) fabric of ceramic fibers disposed adjacent to the layer-to-layer weave, the ceramic matrix composite body including a relatively high in-plane bending stress region, the relatively high in-plane bending stress region including a relatively high in-plane tensile stress region, a relatively high in-plane compression stress region, wherein the at least one layer of 1-directional and/or 2-directional (1D/2D) fabric of ceramic fibers is disposed in the relatively high in-plane tensile stress region and the layer-to-layer weave is disposed in the relatively high in-plane compression stress region.

17. The ceramic matrix composite component of claim 16, wherein a relatively high through-thickness stress region disposed between the relatively high in-plane tensile stress region and the relatively high in-plane compression stress region.

18. The ceramic matrix composite component of claim 17, wherein the ceramic matrix composite body has an outer surface section and an interior mid-section that is disposed adjacent to the outer surface section, wherein the at least one layer of 1D/2D fabric is disposed in the outer surface section of the ceramic matrix composite body, and wherein the layer-to-layer weave is disposed in the interior mid-section of the ceramic matrix composite body.

19. The ceramic matrix composite component of claim 16, wherein ceramic matrix composite body is a non-internally cooled vane or blade of a gas turbine engine having an outer surface section that surrounds a substantially solid interior mid-section, and wherein the at least one layer of 1D/2D fabric is disposed in the outer surface section and the layer-to-layer weave is disposed in the substantially solid interior mid-section of the non-internally cooled vane or blade.

20. The ceramic matrix composite component of claim 16, wherein the ceramic matrix composite body is an annular ceramic matrix composite combustor of a gas turbine engine, wherein the annular ceramic matrix composite combustor has an interior mid-section surrounding a cooling channel and an outside-facing outer surface section that surrounds the interior mid-section, and wherein the at least one layer of 1D/2D fabric is disposed in the outside-facing outer surface section and the layer-to-layer weave is disposed in the interior mid-section of the annular ceramic matrix composite combustor.

* * * * *